United States Patent [19]

Ueno et al.

[11] Patent Number: 4,594,261

[45] Date of Patent: Jun. 10, 1986

[54] METHOD FOR PRODUCING THIN FILM SEMICONDUCTOR DEVICE

[75] Inventors: Masakazu Ueno; Takeshige Ichimura, both of Kanagawa, Japan

[73] Assignee: Director-General of Agency of Industrial Science and Technology, Tokyo, Japan

[21] Appl. No.: 781,378

[22] Filed: Sep. 30, 1985

Related U.S. Application Data

[62] Division of Ser. No. 554,656, Nov. 23, 1983.

[30] Foreign Application Priority Data

Nov. 25, 1982 [JP] Japan ................... 57-205536

[51] Int. Cl.$^4$ ............... H01L 21/205; H01L 31/18
[52] U.S. Cl. ......................... 427/39; 148/1.5
[58] Field of Search ............. 427/39, 74, 86; 148/1.5; 136/258 AM, 258 PC; 357/2, 30, 59 A, 59 R

[56] References Cited

FOREIGN PATENT DOCUMENTS 57-187973 11/1982 Japan ................. 136/258 PC

Primary Examiner—Aaron Weisstuch
Attorney, Agent, or Firm—Sughrue, Mion, Zinn, Macpeak, and Seas

[57] ABSTRACT

A thin film semiconductor device and a method for manufacturing such a device containing a thin film semiconductor layer in which there is no misalignment between a semiconductor layer containing a microcrystalline phase and an adjacent layer having no such phase. A junction region is interposed between the two amorphous semiconductor layers having a microcrystalline phase content which varies gradually from the content of the amorphous semiconductor layer having no microcrystalline phase to that of the layer having a microcrystalline phase. The junction region may be formed by the use of a glow discharge decomposition technique wherein the discharge power is gradually varied.

2 Claims, 3 Drawing Figures

METHOD FOR PRODUCING THIN FILM SEMICONDUCTOR DEVICE

This is a division of application Ser. No. 554,656, filed Nov. 23, 1983.

BACKGROUND OF THE INVENTION

The present invention relates to a thin film semiconductor device having an active region formed in an amorphous semiconductor layer containing microcrystalline phases.

Conventionally, crystalline silicon has typically been used for the fabrication of semiconductor devices. However, since the use of crystalline silicon requires a single crystal silicon wafer as a substrate, the manufacturing cost thereof is high and complicated manufacturing steps are necessary.

On the other hand, a manufacturing process for a semiconductor device using, for example, glow discharge decomposition of hydrogenated amorphous silicon (a-Si:H) requires simpler manufacturing steps than for a similar semiconductor device using single crystal or polycrystalline silicon, and thus the manufacturing cost can be substantially reduced compared with a crystalline device. Recently, it has become possible to form a film of a-Si:H containing microcrystals of a size on the order of 50 Å to 200 Å by increasing the glow discharge power. Such an a-Si:H film containing microcrystals exhibits a smaller optical absorption coefficient and higher doping efficiency than an ordinary a-Si:H film. Therefore, if such an a-Si:H film is used as a window layer in a solar cell, for example, it would appear that a high performance solar cell might be obtainable. However, it has been found that the output current of a solar cell employing an a-Si:H film containing microcrystals is reduced by carrier trapping in the vicinity of the interface between the layer containing microcrystals and the a-Si:H film due to structural misalignment at the interface.

An object of the present invention is thus to provide a thin film semiconductor device which suffers no misalignment between a semiconductor layer containing a microcrystalline phase and an adjacent layer having no such phase in the vicinity of the interface therebetween, while retaining the merits of a device having a microcrystalline phase.

SUMMARY OF THE INVENTION

According to the present invention, the above object is achieved by providing an intermediate layer between an amorphous semiconductor layer containing a microcrystalline phase and an amorphous semiconductor layer having no microcrystalline phase. The fine crystal phase content in the intermediate layer varies gradually between the adjacent two layers.

DESCRIPTION OF THE PREFERRED EMBODIMENTS

Figure 1:
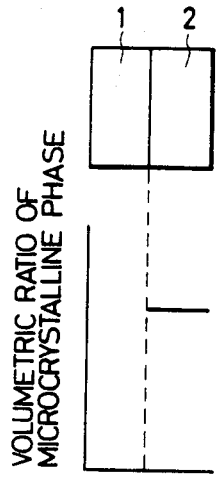
FIG. 1 is a chart showing the volumetric ratio of the microcrystalline phase in relation to the structure of a junction surface between an amorphous semiconductor layer having a microcrystalline phase and an amorphous layer having no microcrystalline phase in a prior art semiconductor device.
Figure 2:
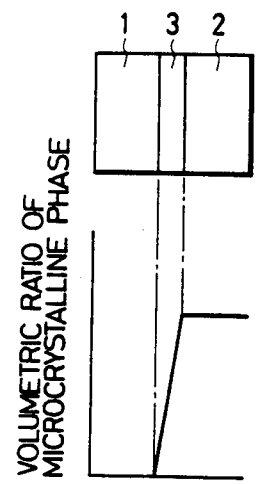
FIG. 2 is a chart showing the volumetric ratio of the microcrystalline phase in relation to the structure of a junction surface in a semiconductor device constructed in accordance with the present invention.

FIG. 1 shows conceptually the structure of a conventional i-n junction between an intrinsic amorphous semiconductor layer 1 which contains no microcrystalline phase and an n-type amorphous semiconductor layer 2 which is doped with phosphorous and which contains a microcrystalline phase. Further, FIG. 2 shows conceptually the junction structure of the preferred embodiment of the present invention and the volumetric ratio of the microcrystalline phase thereof. The present invention is characterized by the provision of a semiconductor layer 3 sandwiched between the layers 1 and 2. Specifically, as indicated in FIG. 2, the layer 3 is provided with n-type conductivity by phosphorus doping. Furthermore, the volumetric ratio of the microcrystalline phase is made to vary in a continuous manner through the layer 3.

With the layer 3 so provided, any possibility of misalignment between the ordinary a-Si:H layer and the a-Si:H layer containing the microcrystalline phase is eliminated. Moreover, the carrier trapping in the vicinity of the interface is minimized.

The layer 3 shown in FIG. 2 in which the volumetric ratio of the microcrystalline phase is continuously changed, may be formed by varying the discharge power during the glow discharge decomposition process by which the layer is preferably formed.

Figure 3:
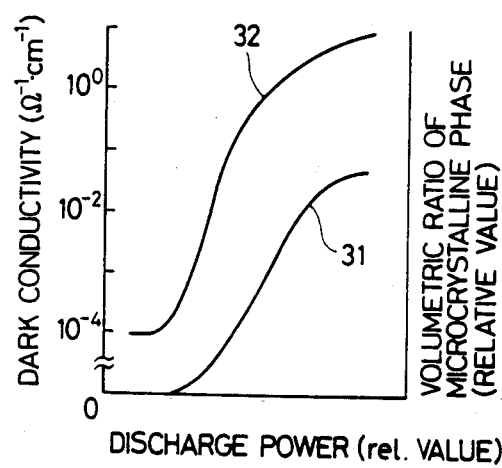
FIG. 3 is a chart showing the relationships between the volumetric ratio of the microcrystalline phase contained in an n-type film and discharge power and between the dark conductivity of the n-type film and discharge power.

FIG. 3 shows the relationship between the discharge power and the dark conductivity of an n-type film obtained using a glow discharge process in a mixture of $SiH_4$ and $PH_3$ gases, and also the relationship between the discharge power and the volumetric ratio of the microcrystalline phase. It is clearly shown by curve 31 in FIG. 3 that the density of microcrystals increases gradually as the discharge power increases. Further, the dark conductivity increases as the discharge power is increased, resulting in an improvement of doping efficiency, as shown by a curve 32.

As described above, in accordance with the present invention, an amorphous semiconductor layer in which the volumetric ratio of microcrystalline phase is continuously changed is provided between an amorphous semiconductor layer and an amorphous semiconductor layer containing microcrystals. This technique eliminates any possibility of misalignment between the latter amorphous semiconductor layers due to structural differences therebetween. Thus, a thin film semiconductor device having the merits of a device employing a layer containing microcrystals is obtained.

It should be noted that although an i-n junction has been described in the above embodiment, the merits of the present invention can be obtained with a p-n junction or a p-i junction, etc. Further, the present invention can be also applied to thin film semiconductor devices formed of amorphous semiconductor materials other than amorphous silicon.

We claim:

1. A method for forming a semiconductor device, comprising the steps:
   providing an amorphous semiconductor layer having substantially no microcrystalline phase;

forming a junction region on said amorphous semiconductor layer having no microcrystalline phase by glow discharge decomposition in which the discharge power is gradually increased over the course of formation, whereby the microcrystalline phase content of said junction region gradually increases in the direction of thickness away from said amorphous semiconductor layer; and forming on said junction region an amorphous semiconductor layer having a microcrystalline phase content substantially the same as the microcrystalline phase content at the interface between said junction region and said amorphous semiconductor layer having a microcrystalline phase.

2. The method of claim 1, wherein said amorphous semiconductor layers and said junction region are formed of silicon.

* * * * *